United States Patent [19]

Pfiester et al.

[11] 4,292,547

[45] Sep. 29, 1981

[54] IGFET DECODE CIRCUIT USING SERIES-COUPLED TRANSISTORS

[75] Inventors: James R. Pfiester, Austin; Doyle V. McAlister, Pflugerville, both of Tex.

[73] Assignee: Motorola, Inc., Schaumburg, Ill.

[21] Appl. No.: 61,206

[22] Filed: Jul. 27, 1979

[51] Int. Cl.³ .................... H03K 19/094; G11C 8/00; H01L 29/52

[52] U.S. Cl. .................................. 307/463; 307/304; 307/DIG. 5; 357/68; 365/230

[58] Field of Search ............... 307/205, 251, 270, 304, 307/DIG. 5; 365/230, 231; 357/68

[56] References Cited

U.S. PATENT DOCUMENTS

| | | | |
|---|---|---|---|
| 3,665,473 | 5/1972 | Heimbigner | 307/DIG. 5 X |
| 4,094,012 | 6/1978 | Perlegos | 307/DIG. 5 X |
| 4,099,162 | 7/1978 | Basse | 307/DIG. 5 X |
| 4,103,349 | 7/1978 | Marmet | 307/DIG. 5 X |
| 4,124,900 | 11/1978 | Smith et al. | 365/230 X |

OTHER PUBLICATIONS

Faggin et al., "Silicon Gate Technology"; *Solid-State Electronics*, Pergamon Press; vol. 13, No. 8, pp. 1125-1144; 1970.

*Primary Examiner*—Larry N. Anagnos
*Attorney, Agent, or Firm*—Joe E. Barbee

[57] ABSTRACT

A decoder circuit suitable for integrated circuit implementation using IGFET processing is disclosed which may be implemented in a highly dense structure. The decoder output lines are grouped in pairs and at least one of the output lines in each pair is discharged as determined by a bit in the input address. A plurality of IGFET devices under the control of the remaining input address bits selectively couple together the two output lines in each pair such that both output lines can then become discharged. Series-coupled pairs of IGFET devices are used in place of a single IGFET device in order to reduce the chip area required to implement the decoder structure.

3 Claims, 4 Drawing Figures

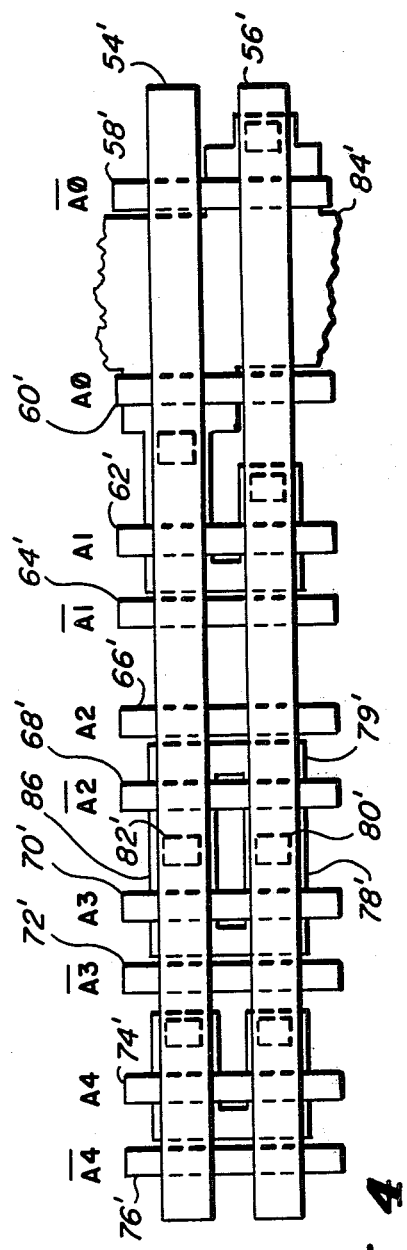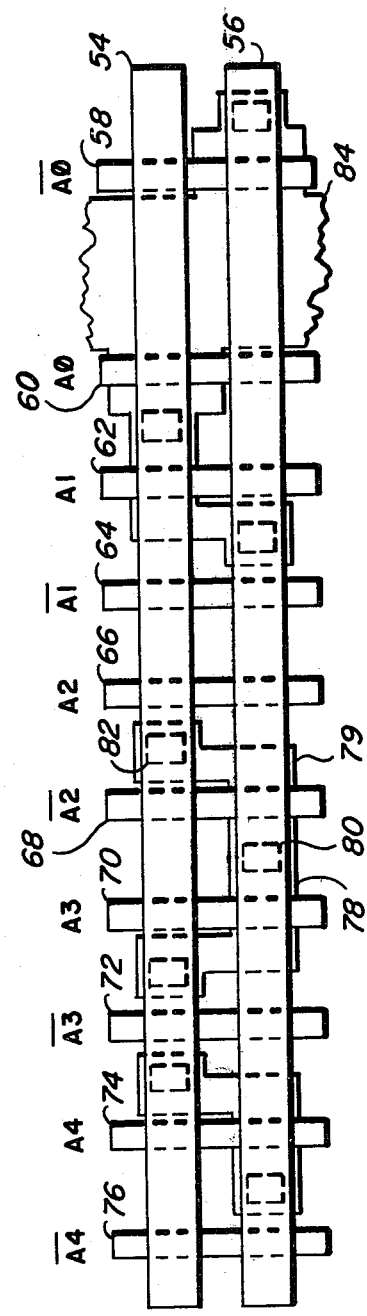

IGFET DECODE CIRCUIT USING SERIES-COUPLED TRANSISTORS

TECHNICAL FIELD

This invention relates generally to decoder circuits and more particularly to a decode circuit which utilizes insulated-gate-field-effect-transistors.

BACKGROUND ART

A decoder circuit is typically required in order to implement both read-only-memories (ROMs) and random-access-memories (RAMs). The memory generally includes $2^N$ words of storage which are addressed by an input address of N bits. The words stored by the memory are arranged in rows and a decoder circuit responsive to the input address is used to select the appropriate row. The decoder circuit is generally fabricated on the same monolithic integrated circuit chip which contains the storage elements of the memory. Therefore, the chip area required by the decoder circuit directly impacts the overall die size of the integrated circuit. It is well known that integrated circuits having a smaller die size have correspondingly higher processing yields which result in lower overall chip costs. Those skilled in the art will appreciate that a decoder circuit suitable for integrated circuit implementation and having a higher circuit density is a significant improvement over the prior art.

BRIEF SUMMARY OF THE INVENTION

It is an object of the present invention to provide a decoder circuit suitable for integrated circuit implementation with increased layout density such that overall chip size can be reduced. This and other objects are accomplished by providing a decoder circuit for selecting one of a plurality of output lines in response to address signals which can be implemented within a semiconductor substrate. Disposed on a surface of the substrate are a plurality of address lines for conducting the address signals and a plurality of output lines electrically isolated from the address lines and representing the output of the decoder circuit. A plurality of semiconductor regions are formed within the substrate in proximity to the surface and having a conductivity type opposite to that of the substrate. The semiconductor regions are formed in proximity to and on either side of various address lines such that an address line serves as gate electrodes for a plurality of IGFET transistors. A first and a second output line are electrically coupled, respectively, to first and second semiconductor regions on one side of a particular address line while a third semiconductor region is formed in proximity to the first and second semiconductor regions but on the opposite side of the particular address line such that IGFET transistors are formed between the first and third semiconductor regions and between the second and third semiconductor regions. The signal conducted by the address line selectively renders the IGFET transistors conductive such that the first output line is shorted to the second output line. Since the first and second output lines make electrical coupling to the first and second semiconductor regions on the same side of the particular address line, the plurality of address lines can be spaced closer together resulting in a decoder circuit having higher circuit density.

BRIEF DESCRIPTION OF THE DRAWINGS

FIG. 3 is a layout drawing which illustrates how the circuit shown in FIG. 1 would be fabricated as a monolithic integrated circuit.

FIG. 4 is a layout drawing which illustrates how the circuit shown in FIG. 2 would be fabricated as a monolithic integrated circuit and illustrates the die area savings over the layout drawing shown in FIG. 3.

DETAILED DESCRIPTION OF THE INVENTION

Figure 1:
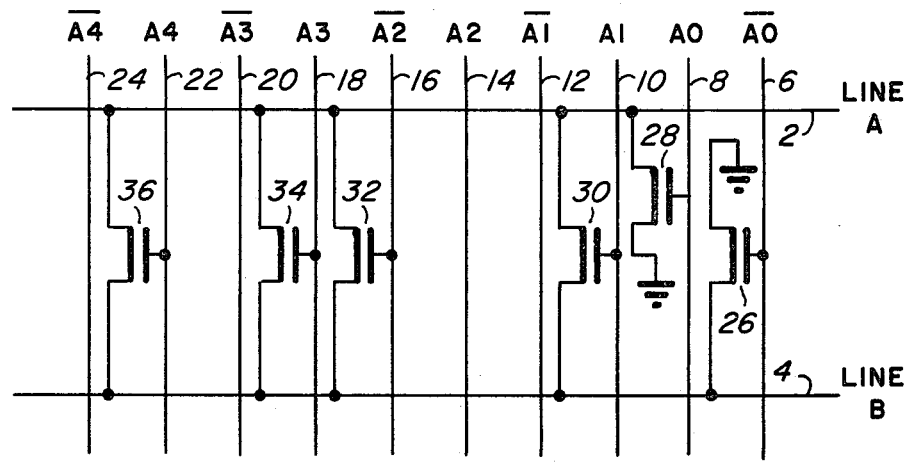
FIG. 1 is a circuit schematic of a portion of an IGFET decoder circuit.

In FIG. 1, a circuit schematic is illustrated for a portion of a decoder circuit which may be used to select a particular row in a memory. The decoder circuit illustrated in FIG. 1 is responsive to a 5-bit input address (A4, A3, A2, A1, A0). Address buffer circuitry (not shown) is used to generate true and complement address signals based upon the input address. The true and complement address signals are conducted by address line conductors 6-24. The decoder circuit includes 32 output line conductors, only two of which (2, 4) are illustrated to simplify the drawings. An output line is selected when it is at a high level and is deselected when it is at ground potential.

Address lines 6 and 8 conduct complementary signals $\overline{A0}$ and A0, respectively. The decoder circuit of FIG. 1 includes insulated-gate-field-effect-transistors (IGFETs) 26 and 28 which have their gate electrodes coupled, respectively, to address lines 6 and 8. Since the operation of IGFET transistors is well known in the art, they will not be further described. Detailed information concerning the operation of these devices is contained in *Physics and Technology of Semiconductor Devices*, by A. S. Grove, John Wiley and Sons, Inc., 1967. IGFET 26 has its source electrode coupled to ground potential and its drain electrode coupled to output line 4. IGFET device 28 has its source coupled to ground potential and its drain electrode coupled to output line 2. Those skilled in the art should realize that references to the source and drain electrodes of a particular IGFET device are for purposes of description only since an IGFET device is bidirectionally conductive, and the source and drain electrodes may be interchanged without affecting circuit performance.

Since signals A0 and $\overline{A0}$ are complements of each other, one of the IGFET devices 26 or 28, will be conductive while the other of these devices will not be conductive, depending upon which of the address signals, A0 or $\overline{A0}$, is at a high level. For example, if address signal A0 is at a high level while address signal $\overline{A0}$ is at a low level, then IGFET device 28 will be conductive and will short output line 2 to ground potential while IGFET device 26 will remain nonconductive. The remaining 30 output lines (not shown) in the decoder circuit of FIG. 1 are arranged in pairs similar to output lines 2 and 4 and include IGFET devices corresponding to IGFET 26 and IGFET 28 which are also controlled by address lines 6 and 8. Thus, 16 of the total of 32 output lines are directly coupled to ground potential in response to the address signals A0 and $\overline{A0}$.

Also associated with output lines 2 and 4 are IGFET devices 30, 32, 34 and 36 which can selectively create an electrical short between output lines 2 and 4. Each of these IGFET devices has its drain electrode coupled to output line 2 and its source electrode coupled to output line 4. The gate electrode of IGFET device 30 is coupled to address line 10 which conducts address signal A1. Similarly, the gate electrodes of IGFET devices 32, 34 and 36 are coupled to address lines 16, 18 and 22 and are controlled by address signals $\overline{A2}$, A3, and A4, respectively. When any of the previously mentioned address signals is at a high level, the corresponding IGFET device is made conductive such that output line 2 is shorted to output line 4.

The operation of the decoder circuit illustrated in FIG. 1 will now be described. Initially, all 32 output lines in the decoder circuit are dynamically precharged to a high level prior to allowing address lines 6 or 8 (A0 or $\overline{A0}$) to be at a high level. The circuitry for dynamically precharging the output lines is not illustrated but is well known to those skilled in the art. After the initial precharge operation, the proper address control signals are coupled to address lines 6–24. For purposes of illustration, assume that the address control signals are such that A4=0, A3=0, A2=1, A1=0, and A0=1. In this case, output line 2 is directly discharged to ground potential by IGFET device 28. Since $\overline{A0}$ is at a low level, IGFET device 26 is not conductive. Similarly, since A1, $\overline{A2}$, A3, and A4 are each at a low level, IGFET devices 30, 32, 34 and 36 are each nonconductive. Therefore, output line 4 remains at its precharged high level such that output line 4 is the decoder output line selected by the input address. However, if in the above example, control signal A4 were changed to equal "1", then IGFET device 36 would be conductive and would discharge output line 4 to ground potential. In this event, one of the output lines in another output line pair would be selected by the decoder.

Figure 2:
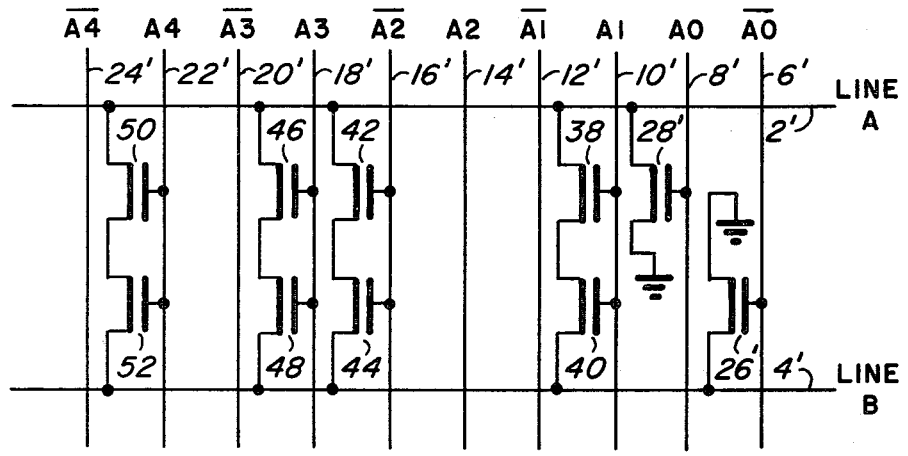
FIG. 2 is a circuit schematic of a portion of an IGFET decoder circuit using series-coupled transistors according to a preferred embodiment of the invention.

In FIG. 2, a circuit schematic is shown for a decoder circuit according to a preferred embodiment of the invention. The output lines and address lines are similar to those shown in FIG. 1 and are accordingly numbered with a primed notation relative to FIG. 1. The circuit of FIG. 2 also includes IGFET devices 26' and 28' which function in the same manner as corresponding IGFET devices 26 and 28 in the circuit of FIG. 1. However it will be noted that IGFET device 30 in FIG. 1 has been replaced by series-coupled IGFET devices 38 and 40 in FIG. 2. The drain of IGFET device 38 is coupled to output line 2' and the source electrode of IGFET 38 is coupled to the drain electrode of IGFET 40. The source electrode of IGFET 40 is coupled to output line 4'. The gate electrodes of IGFET devices 38 and 40 are each coupled to address line 10' which conducts address signal A1. Similarly, IGFET devices 32, 34 and 36 in FIG. 1 have been replaced by series-coupled IGFET device pairs 42 and 44, 46 and 48, and 50 and 52, respectively. The operation of the circuitry shown in FIG. 2 is identical to the operation previously described for FIG. 1 except that the discharge path between output lines 2' and 4' is through a series-coupled pair of IGFET devices rather than through a single IGFET device. Although the circuit shown in FIG. 2 appears to suffer from the disadvantage that the number of required IGFET devices has been increased, it will become apparent from FIGS. 3 and 4 that the circuit of FIG. 2 is actually more dense than the circuit of FIG. 1.

In FIG. 3, a layout drawing is shown which corresponds to a minimized implementation of the circuit shown in FIG. 1. A first metal line 54 corresponds to output line 2 in FIG. 1. Similarly, a second metal line 56 corresponds to output line 4 in FIG. 1. These metal lines are disposed on the surface of a semiconductor substrate in which the decoder circuit is formed. Polysilicon runs 58–76 are also disposed on the surface of the substrate and correspond to the address line conductors 6–24 shown in FIG. 1. The polysilicon runs are insulated from both the semiconductor substrate and from metal runs 54 and 56 by an insulating layer of oxide. In addition to serving as conductors for the address signals, polysilicon runs 58–76 serve as gate electrodes for IGFET devices as will be explained below.

Region 78 in FIG. 3 is a semiconductor region of highly doped N-type semiconductor material which is formed within the P-type substrate near the surface. Region 78 may be formed either by diffusion, implanting, or other methods well known in the art. Similarly, semiconductor region 79 is also a highly doped N-type semiconductor region formed within the substrate near the surface. The square regions designated 80 and 82 in FIG. 3 indicate positions where the insulating layer on the surface of the substrate has been etched away such that metal runs 54 and 56 make electrical contact with semiconductor regions 79 and 78, respectively. Semiconductor regions 78 and 79 each border polysilicon run 68 which is used to conduct address signal $\overline{A2}$. When address signal $\overline{A2}$ is at a high level, a channel of N-type carriers is enhanced in the semiconductor substrate immediately below polysilicon line 68 which electrically couples semiconductor region 78 to semiconductor region 79, thereby shorting metal line 54 to metal line 56. It will be noted that semiconductor region 84 is also a highly doped N-type region which is coupled to a source of ground potential such that metal runs 54 and 56 are alternately discharged by the IGFET devices formed in the vicinity of polysilicon runs 58 and 60.

It will be noted that in the layout drawing of FIG. 3, the spacing between adjacent polysilicon runs (address lines) is uniform since space must be allowed to insert a metal contact, such as contacts 80 and 82, between each pair of adjacent address lines. Although no contact is shown between address line 64 ($\overline{A1}$) and address line 66 (A2), these address lines may not be moved closer together since these polysilicon lines are used to form IGFET devices in other portions of the decoder circuit, i.e., in other output line pairs.

In FIG. 4, a layout drawing is illustrated of an implementation of the decoder circuit shown in FIG. 2 according to the preferred embodiment of the invention. Metal runs 54' and 56' correspond to output lines 2' and 4' in FIG. 2. Similarly, polysilicon runs 58'–76' correspond to address lines 6'–24' in FIG. 2. Semiconductor regions 78', 79', and 86 are all highly doped N-type semiconductor regions which have been formed in the P-type substrate. Like the implementation shown in FIG. 3, metal run 56' makes electrical contact to semiconductor region 78' through contact 80'. However, unlike the implementation shown in FIG. 3, metal run 54' does not make electrical contact to semiconductor region 79'. Instead, metal run 54' makes electrical contact with semiconductor region 86. When polysilicon run 68' (address line $\overline{A2}$) is at a high level, channels are simultaneously enhanced between semiconductor region 78' and semiconductor region 79' and between semiconductor region 86 and semiconductor region 79'. Thus, polysilicon run 68' in combination with semiconductor regions 78', 79', and 86 form two series-coupled IGFET devices which are coupled between metal runs 54' and 56'. These series-coupled transistors perform the same function as the IGFET transistor formed by polysilicon run 68 and semiconductor regions 78 and 79 in FIG. 3. However, it will be noted that polysilicon runs 68' and 66' are spaced much closer together in FIG. 4 than is the case for polysilicon runs 68 and 66 in FIG. 3. Similarly the spacing is also at a minimum between polysilicon runs 62' and 64' (A1 and $\overline{A1}$), between polysilicon runs 70' and 72' (A3 and $\overline{A3}$) and between polysilicon runs 74' and 76' (A4 and $\overline{A4}$). As a result, the implementation of the decoder circuit shown in FIG. 4 requires less chip area than does the corresponding implementation illustrated in FIG. 3. Since there are 15 other pairs of output lines in the overall decoder circuit, the area savings illustrated by comparing FIG. 3 and FIG. 4 is multiplied by 16. Also, the chip area savings is even greater when the number of bits in the input address is extended beyond the five bits used in the described embodiment. Also, since the output lines of the decoder circuit are formed by metal runs, there is less capacitive charge associated with the output lines and the discharge time of the output lines is minimized.

Step by step processing details of the layout implementations shown in FIGS. 3 and 4 will not be recited herein as these are well known in the art. One such method for fabricating the implementations shown in FIGS. 3 and 4 may be found in "Silicon Gate Technology" by Faggin and Klein, *Solid-State Electronics,* Pergamon Press, 1970, Volume 13, pages 1125-1144.

It will be appreciated by those skilled in the art that a decoder circuit suitable for integrated circuit implementation and having a highly dense structure has been described. While the invention has been described with reference to a preferred embodiment, the description is for illustrative purposes only and is not to be construed as limiting the scope of the invention. Various modifications and changes may occur to those skilled in the art without departing from the true spirit and scope of the invention as defined in the appended claims.

We claim:

1. A decoder circuit for selecting one of a plurality of output lines in response to address signals comprising:
   (a) a plurality of address lines for conducting the address signals, the plurality of address lines including first, second and third address lines, the first and second address lines conducting address signals which are logical complements of each other;
   (b) a plurality of output lines including a first and a second output line;
   (c) first and second switching means each having a control electrode and first and second conduction electrodes, the first conduction electrode of the first and second switching means being coupled to a reference voltage source, the second conduction electrode of the first and second switching means being coupled, respectively, to the first and second output lines, and the control electrodes of the first and second switching means being coupled, respectively, to the first and second address lines; and
   (d) third and fourth switching means each having a control electrode and first and second conduction electrodes, the first conduction electrodes of the third and fourth switching means being coupled, respectively, to the first and second output lines, the second conduction electrodes of the third and fourth switching means being coupled to each other, and the control electrodes of the third and fourth switching means being coupled to the third address line for selectively effecting electrical coupling between the first and second output lines.

2. A decoder circuit as recited in claim 1 wherein the first, second, third and fourth switching means each comprise an insulated-gate-field-effect-transistor having gate, source, and drain electrodes, the gate electrode corresponding to a control electrode and the source and drain electrodes corresponding to first and second conduction electrodes of the respective switching means.

3. A decoder circuit implemented within a semiconductor substrate of a first conductivity type for selecting one of a plurality of output lines in response to address signals, comprising:
   (a) a plurality of address lines disposed on a surface of the substrate and electrically isolated from the substrate for conducting a plurality of address signals, the plurality of address lines including a first address line;
   (b) a plurality of semiconductor regions of a conductivity type opposite to the first conductivity type and formed within the substrate in proximity to the surface of the substrate, the plurality of semiconductor regions including first, second and third semiconductor regions formed in proximity to the first address line, the first and second semiconductor regions being on a first side of the first address line and the third semiconductor region being on a side of the first address line opposite the first side such that the first address line is effective to selectively enhance a channel between the first and third semiconductor regions and between the second and third semiconductor regions; and
   (c) a plurality of output lines disposed on the surface of the substrate and electrically isolated from the plurality of address lines, the plurality of output lines including first and second output lines which are electrically coupled, respectively, to the first and second semiconductor regions such that the first and second output lines are electrically coupled to each other by the channels enhanced between the first and third semiconductor regions and between the second and third semiconductor regions in response to the address signal conducted by the first address line.

* * * * *